April 24, 1956 L. E. NORTON 2,743,365

FREQUENCY STABILIZATION

Filed April 27, 1951

INVENTOR
Lowell E. Norton
BY J. L. Whittaker
ATTORNEY

United States Patent Office 2,743,365

Patented Apr. 24, 1956

2,743,365

FREQUENCY STABILIZATION

Lowell E. Norton, Princeton, N. J., assignor to Radio Corporation of America, a corporation of Delaware Application April 27, 1951, Serial No. 223,280

6 Claims. (Cl. 250—36)

This invention relates to frequency-stabilization of oscillators and particularly to stabilization of microwave oscillators from spectral gas-line standards.

It is a primary object of the invention to frequency-stabilize an oscillator having input and output frequencies which are harmonically related, as in a frequency-multiplier oscillator, from the reactance effects exhibited by high-Q frequency standard at a resonance frequency substantially higher than the input and output frequencies of the oscillator.

In accordance with the present invention, the different input and output frequencies of the oscillator to be stabilized are frequency-multiplied and then combined or mixed to produce a frequency difference control signal applied as feedback to the input of the oscillator. One of the multiplied frequencies, prior to the aforesaid mixing, is impressed upon a high-Q standard to produce a phase-shift varying in sense and magnitude with deviation from a proper value of the multiplied frequency, which phase-shift appears in the frequency difference control signal for rigid stabilization of the oscillator frequency.

More particularly, the different input and output frequencies of the oscillator are respectively impressed upon two channels each including a frequency-multiplier or harmonic generator to produce two signals whose difference in frequency corresponds with the input frequency of the oscillator. One of the channels also includes a high-Q frequency standard, preferably a body of molecularly resonant gas which exhibits rapidly changing reactance for deviations of the impressed signal. The two channels provide inputs for a mixer whose output includes a stabilizing signal of frequency equal to the oscillator input frequency and of phase controlled by the standard. This difference frequency is applied as feedback to the input circuit of the oscillator for sustained generation of frequency-stabilized oscillations.

Further in accordance with the invention, a relatively low frequency, fixed or incrementally adjustable in value, may be combined with the frequency-multiplied signals to provide for stabilization of the oscillator at a frequency or frequencies offset from exact subharmonic relation to the resonant frequency of the stabilizing standard.

The invention further resides in frequency-stabilizing methods and arrangements having features of novelty and utility hereinafter described and claimed.

Figure 1:
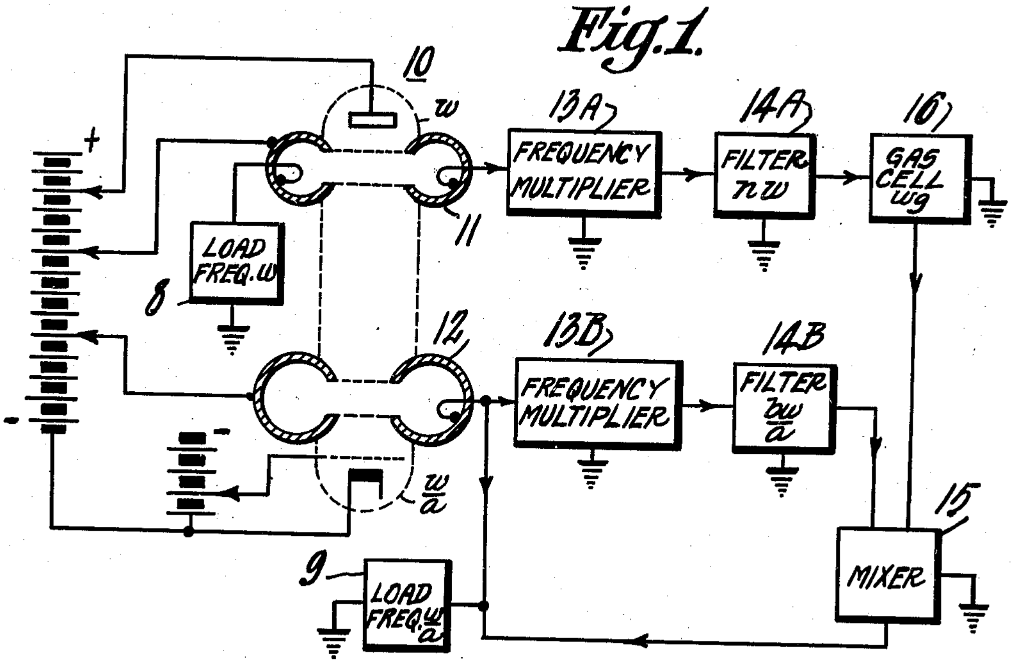
Figure 2:
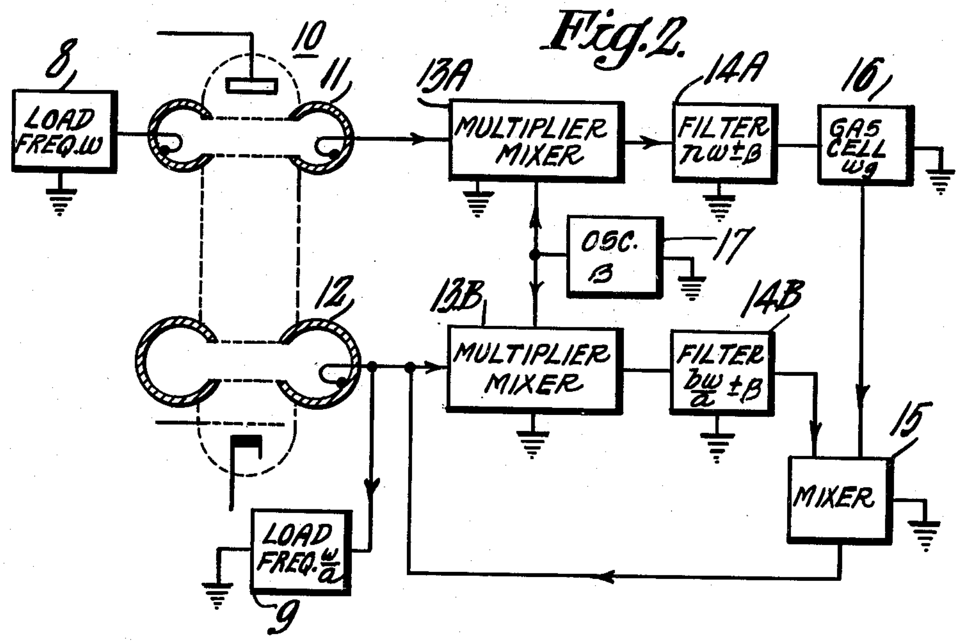

For a more detailed understanding of the invention and for illustration of systems embodying it, reference is made to the accompanying drawings in which:

Figs. 1 and 2 are block diagrams of frequency-stabilized oscillator systems embodying the invention.

Referring to Fig. 1, the klystron 10 is exemplary of a frequency-multiplying type; specifically the utput circuit or cavity 11 of the oscillator is tuned or tunable to the desired operating frequency $\omega$, which may be applied to a load 8, and the input circuit or cavity 12 of the oscillator is tuned or tunable to a subharmonic $$\frac{\omega}{a}$$

of the output frequency which may be applied to a second load 9. The output frequency of the oscillator 10 is impressed upon a frequency-multiplier 13A, which for microwave frequencies may simply be a diode. The frequency-multiplier 13A includes or is associated with a filter 14A which passes or selects the desired nth harmonic of the output frequency; the filter 14A may be of simple type since it need only be good enough to reject the next adjacent harmonics $(n+1)\omega$, $(n-1)\omega$.

The input frequency $$\frac{\omega}{a}$$

of the oscillator is also impressed upon a frequency-multiplier 13B, which for convenience at microwave frequencies may simply be a diode. The frequency-multiplier 13B includes or is associated with a filter 14B for selectively passing the $b$th harmonic of the input frequency. The filter 14B may be of simple type or construction since it need be only good enough to reject the next adjacent harmonics $$\left[(b+1)\frac{\omega}{a}\right], \left[(b-1)\frac{\omega}{a}\right]$$

The frequencies $n\omega$ $$\frac{b\omega}{a}$$

passed by the two filters are impressed upon a mixer 15 which for microwave frequencies may be a simple diode. Assuming that the frequency $n\omega$ is greater than $$\frac{b\omega}{a}$$

the difference frequency appearing in the output circuit of mixer 15 and applied back to the input circuit or cavity 12 of the oscillator is $$\left(n\omega-\frac{b\omega}{a}\right)$$

For sustained generation of oscillations by the oscillator, this frequency difference must be equal to the input frequency $$\frac{\omega}{a}$$

In brief, the relation to be satisfied for sustained generation of oscillations under the conditions assumed may be expressed as $$n\omega-\frac{b\omega}{a}=\frac{\omega}{a} \tag{1}$$

This relation is satisfied when $$b=na-1 \tag{2}$$

To give a specific example, the oscillator 10 may be a 2K46 klystron with its input and output circuits 11, 12 respectively tuned to the frequencies closely approximating $2725\frac{79}{90}$ megacycles and $8177\frac{19}{30}$ megacycles. From these frequency values, it can be seen that the term $a$ of Equation 2 has the value 3. Assuming that frequency-multiplier 13A is tripling, i. e., $n=3$, the output of the signal from filter 14A is 24,532.9 megacycles ($n\omega$). By producing and selecting the 8th harmonic ($b=8$) of the input frequency of the oscillator, the frequency-multiplied signal $$\left(\frac{b\omega}{a}\right)$$

passed by filter 14B to the mixer is $21{,}807\tfrac{1}{45}$ megacycles. Thus, the difference frequency $(24{,}532.9-21{,}807\tfrac{1}{45})$ in the output of mixer 15 is equal to the input frequency $$\left(\frac{\omega}{a}=2725\tfrac{79}{90}\right)$$

For rigid stabilization of the frequency of oscillator 10, the gas cell 16 is included in one of the input channels to the mixer 15: in the particular arrangement shown in Fig. 1, the gas cell 16 is included in the channel from the output circuit or cavity 11 to mixer 15. In such case, the gas in cell 16 should exhibit molecular resonance at the frequency $n\omega$ passed by filter 14A. In the particular numerical example above given, the desired value of frequency $n\omega$ is 24,532.9 megacycles which is the frequency of the 5,5 spectral line of $NH_3$. In the neighborhood of this molecular resonance frequency, the gas exhibits a steep reactance characteristic which reverses in sign for deviations in opposite sense from that frequency of the applied signal. Thus, if there is deviation of the harmonic frequency $n\omega$ from the gas-line frequency $\omega_g$, the harmonic frequency is subjected to a phase-shift in sense and magnitude dependent upon the deviation. This phase-shift appears in the difference-frequency in the output of the mixer 15 and is effective under the conditions above assumed rigidly to stabilize the output frequency $\omega$ at the value expressed by $$\omega=\left(a-\frac{b}{n}\right)\omega_g \tag{3}$$

It will be recalled that the foregoing is upon the assumption that the values $n$ and $b$ are so selected that the harmonic frequency $n\omega$ is greater than the harmonic frequency $$\frac{b\omega}{a}$$

It is also possible to effect stabilization from the gas-line frequency when the harmonic frequency $n\omega$ is less than harmonic frequency $$\frac{b\omega}{a}$$

if the values $b$ and $n$ are so selected for any given oscillator that there is satisfied the relation expressed by $$b=na+1 \tag{4}$$

in which case the output frequency of the oscillator is stabilized in accordance with the relation expressed by $$\omega=\left(\frac{b}{n}-a\right)\omega_g \tag{5}$$

However, by comparing Equations 3 and 5, it is evident that for the same output frequency $\omega$, the harmonic selected to satisfy Equation 5 must be of higher order than selected to satisfy Equation 3 and accordingly the relation expressed by Equation 3 is the preferred one.

It is also possible to effect stabilization of the system shown in Fig. 1 by including the gas cell 16 or equivalent high-Q frequency standard in the channel between the mixer 15 and the input circuit or cavity 12. In such case, the output frequency of the oscillator can be stabilized in accordance with a selected one of the relations expressed by $$\omega=\left(\frac{na^2}{b}-a\right)\omega_g \tag{6}$$

$$\omega=\left(a-\frac{na^2}{b}\right)\omega_g \tag{7}$$

depending upon whether the output harmonic frequency $n\omega$ is greater or less than the input harmonic frequency $$\frac{b\omega}{a}$$

As explained more fully in copending applications, including application Serial No. 218,808, various gases including $NH_3$, COS, $CH_3$, $NH_2$ and $SO_2$ exhibit selective absorption in the microwave region of the frequency spectrum and when confined at low pressures of the order of millimeters of mercury, the absorption region breaks up into a plurality of sharply defined lines, each precisely corresponding with a particular frequency. The effective Q of such lines is upwards of 40,000 and Q's as high as 100,000 are readily available with the gas confined in a length of waveguide or in a resonant cavity for use as the frequency standard 16.

As above stated, the frequency of the 5,5 spectral line of ammonia is 24,532.9 and with the gas at a pressure of $10^{-2}$ millimeters of mercury or less, the effective Q of the line is upwards of 40,000. At frequencies of this order, it is also feasible to obtain a Q as high as 5,000 or more from a resonant cavity or chamber but its resonant frequency, in absence of compensations difficult or impossible to achieve, is subject to variation with change of impedance conditions such as pressure or temperature, whereas the molecular frequency of a gas line is unaffected by any known factor except a strong electric or magnetic field which is easily avoided. For rigid stabilization at a precise frequency, it is therefore preferred that the frequency standard 16 be a gas-absorption line.

The impedance change of a resonant circuit or element in the neighborhood of its resonant frequency $f_0$ can be expressed as $$Z=Z_0\left(1-i2\frac{\Delta f}{f_0Q}\right) \tag{8}$$

where $Z_0$ has dimensions of a resistance, Q has its usual significance, and $\Delta f_0$ is the incremental change of the impressed frequency.

The phase angle $\psi$ of the circuit or element near resonance may therefore be expressed as the angle whose tangent is $$\tan\psi=-2\frac{\Delta f}{f_0}Q \tag{9}$$

the angle being leading or lagging for opposite senses of deviation for frequency $f_0$.

Consequently, when the frequency standard is a chamber or cavity containing, at suitably low pressure, a gas exhibiting molecular resonance and so having a Q upwards of 50,000 or so, the phase angle of the equivalent impedances Z varies extremely rapidly with departure of the impressed frequency from the resonant frequency of the gas. For zero deviation of the impressed frequency, the phase angle is zero, but upon deviation of the impressed frequency from the molecularly resonant frequency of the gas, the phase angle $\psi$ rapidly changes and in positive or negative sense depending upon the sense of deviation.

When as in Fig. 1 the gas cell 16 is included in the channel including filter 14A, the frequency $n\omega$ is impressed upon the gas cell and consequently Equation 9 may be rewritten as $$\tan\psi=-2\frac{\Delta(n\omega)}{\omega_g}Q \tag{10}$$

wherein $\Delta n\omega$ is the incremental change of the $n$th harmonic of the oscillator output frequency $\omega$ and $\omega_g$ is the molecular resonant frequency of the gas.

As appears from comparison of Equations 9 and 10, the phase angle changes the more rapidly when the frequency impressed upon the standard is a harmonic of the oscillator frequency to be stabilized: in short, the stiffness factor of the control is increased by the order of the harmonic.

For stabilization of the oscillator at a frequency which is not an exact subharmonic of a gas line, a relatively low frequency may be combined or mixed with the harmonics prior to their impression upon filter 15 and prior to impression of one of the harmonics upon the frequency standard 16: when in addition multi-channel operation of the oscillator is desired at equi-spaced microwave frequencies, the relatively low frequency so combined with the harmonics may be incrementally adjustable in equal steps.

In copending application Serial No. 224,002, filed May 1, 1951, such methods and arrangements are generically claimed and there are specifically illustrated and described arrangements in which the input and output frequencies of the stabilized oscillator are the same. To accomplish such result in a frequency multiplying oscillator system such as shown in Fig. 1 hereof, the offset and/or incrementally adjustable frequency B (as produced by a suitable source 17 thereof per se disclosed and claimed in the aforesaid pending application) is impressed upon the mixers 13A, 13B respectively connected to the differently tuned input and output circuits 11 and 12 of the generator 10. At microwave frequencies, these mixers may simply be diodes which also serve as frequency-multipliers: at these or lower frequencies, the frequency multiplication and mixing may be performed by separate, as per se known, devices. In such system (Fig. 2) the output frequency at which the oscillator 10 is stabilized from the gas line or equivalent high-Q standard is defined by a selected one of the Equations 3, 5, 6, or 7 with addition of a term including the modulating frequency B. Specifically, the output frequency $\omega$ is stabilized at a selected one of the relations defined by

(11) $$\omega=\left(a-\frac{b}{n}\right)\omega_s\mp\left(a-\frac{b}{n}\right)B$$

(12) $$\omega=\left(\frac{b}{n}-a\right)\omega_s\mp\left(\frac{b}{n}-a\right)B$$

(13) $$\omega=\left(a-\frac{na^2}{b}\right)\omega_s\mp\left(a-\frac{na^2}{b}\right)B$$

(14) $$\omega=\left(\frac{na^2}{b}-a\right)\omega_s\mp m\left(\frac{na^2}{b}-a\right)B$$

Which of the relations is selectively established depends upon the same considerations discussed in Fig. 1.

It shall be understood the invention is not limited to the particular arrangements specifically disclosed and that changes and modifications may be made within the scope of the appended claims.

What is claimed is:

1. A system comprising a frequency-multiplying oscillator having distinct input and output circuits respectively tuned to frequencies $$\frac{\omega}{a}$$

and $\omega$ (where $a$ is an integer greater than one), a pair of frequency-multiplying means respectively in circuit with said input and output circuits to produce the harmonic frequencies $n\omega$ and $$\frac{b\omega}{a}$$

where $n$ and $b$ are integers, a mixer upon which said harmonic frequencies are impressed and whose difference-frequency output is applied to said oscillator input circuit, and a high-Q frequency standard in circuit between one of said frequency-multiplying means output and said mixer to shift the phase of the output of said one frequency multiplying means in sense corresponding with deviations from a desired value thereof before application to said mixer.

2. A system as in claim 1 in which the oscillator is a klystron having cavities respectively tuned to frequencies $\omega$ and $$\frac{\omega}{a}$$

and forming respectively input and output circuits thereof.

3. A system as in claim 1 in which the high-Q frequency standard is a body of gas confined at low pressure and exhibiting sharp molecular resonance at the impressed frequency.

4. A system as in claim 3 in which the gas standard is in circuit with the frequency-multiplying means producing the harmonic frequency $n\omega$.

5. A system as in claim 3 in which the gas standard is in circuit with the frequency-multiplying means producing the harmonic frequency $$\frac{b\omega}{a}$$

6. A system as in claim 1 additionally including a source of relatively low frequency oscillations B, and means for mixing said low-frequency oscillations with said harmonic frequencies $\omega$ and $$\frac{b\omega}{a}$$

prior to their impression upon the said mixer and prior to impression of one of them upon the frequency standard.

References Cited in the file of this patent

UNITED STATES PATENTS

| | | |
|---|---|---|
| 1,450,966 | Affel | Apr. 10, 1923 |
| 2,410,817 | Ginzton et al. | Nov. 12, 1946 |
| 2,559,719 | Hershberger | July 10, 1951 |
| 2,560,365 | Norton | July 10, 1951 |
| 2,562,927 | Levinthal | Aug. 7, 1951 |